(12) United States Patent
Chang

(10) Patent No.: US 6,858,506 B2
(45) Date of Patent: Feb. 22, 2005

(54) METHOD FOR FABRICATING LOCALLY STRAINED CHANNEL

(75) Inventor: Kent Kuohua Chang, Taipei (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/605,122

(22) Filed: Sep. 10, 2003

(65) Prior Publication Data

US 2004/0115888 A1 Jun. 17, 2004

Related U.S. Application Data

(63) Continuation-in-part of application No. 10/064,705, filed on Aug. 8, 2002, now abandoned.

(51) Int. Cl.[7] .............................................. H01L 21/336
(52) U.S. Cl. ..................... 438/301; 438/305; 438/300; 438/264
(58) Field of Search ................................. 438/301, 305, 438/300, 264, 282, 289, 291, 292, 424, 585

(56) References Cited

U.S. PATENT DOCUMENTS 6,071,783 A * 6/2000 Liang et al. ................. 438/301
6,600,170 B1 * 7/2003 Xiang ........................... 257/18

* cited by examiner

Primary Examiner—John F. Niebling
Assistant Examiner—Walter L Lindsay, Jr.
(74) Attorney, Agent, or Firm—Jianq Chyun IP Office

(57) ABSTRACT

A manufacturing method for a semiconductor device is provided, wherein a silicon germanium ($Si_{1-x}Ge_x$; SiGe) layer and a strained silicon layer are sequentially formed on a semiconductor substrate. A gate oxide layer and a gate structure are further formed on the strained silicon layer. The gate structure and the strained silicon layer are heavily doped with n-type dopants to form a compressed gate and source/drain regions, respectively. A cap layer is further formed over the semiconductor substrate, followed by conducting an annealing process. The cap layer is subsequently removed.

23 Claims, 6 Drawing Sheets

METHOD FOR FABRICATING LOCALLY STRAINED CHANNEL

CROSS REFERENCE TO RELATED APPLICATIONS

This application is a continuation-in-part of a prior application Ser. No. 10/064,705, filed Aug. 8, 2002 now abandoned, which is incorporated herein by reference.

BACKGROUND OF INVENTION

1. Field of Invention

The present invention relates to a manufacture method for a semiconductor device. More particularly, the present invention relates to a fabrication method for a semiconductor device with a locally strained channel.

2. Description of Related Art

The metal-oxide-semiconductor (MOS) transistor is an important device applied in very-large-integrated-circuits such as microprocessors and semiconductor memories. In addition to a gate oxide layer and a conductive gate structure, the MOSFET transistor further includes a source/drain region having a conductivity type opposite to that of the substrate.

FIG. 1 illustrates the cross-sectional view of a prior-art semiconductor device structure. As shown in FIG. 1, the prior art structure comprises a substrate 100, a gate oxide layer 102, a gate structure 104 and a source/drain region 106. The gate oxide layer 102 is disposed on the surface of a portion of the substrate 100, while the gate structure 104 is disposed on the gate oxide layer 102. The source/drain region 106 is arranged at both sides of the gate structure 104 in the substrate 100.

To enhance the device performances, a silicon layer, which has received a tensile strain, is sometimes used as a channel. Strained silicon layer is the result of biaxial tensile stress induced in silicon grown on a substrate formed with a material whose lattice constant is greater than that of silicon, for example a silicon germanium layer. Strained silicon is shown to modify the electron or hole mobility of the silicon layer, which in turns affect the performance of a device. Larger enhancements of electron or hole mobility require a higher amount of strain.

Moreover, to increase the number of components per IC chip, the device dimensions must be scaled down. As the device dimension continues to shrink, the source/drain regions also become smaller. The smaller the source/drain region is, the higher is the resistance, thus reducing the current of the device and inducing over loading. However, if the junction depth of the source/drain region is increased to improve the aforementioned problems, new issues, including short channel effects and junction leakage, can arise. On the other hand, if heavy dosage implantation is used to reduce the resistance, solid solubility limitation may hamper application of heavy dosage implantation for forming shallow junction for the source/drain regions. In the prior art, the shallow junction source/drain region is coupled with shrunk spacers for preventing short channel effects. However, the resulted silicided shallow junction may lead to unacceptable junction leakage and further increase the junction resistance.

SUMMARY OF INVENTION

The invention provides a manufacturing method for a semiconductor device, wherein the channel is locally strained to modify the carrier transport properties.

The invention further provides a manufacturing method for a semiconductor device for decreasing the resistance of the source/drain region.

Accordingly, the present invention provides a manufacturing method for a semiconductor device, which is applicable for forming a strained channel. Because the gate structure is under a compressive stress, tensile strain is introduced to the channel.

The invention further provides a manufacturing method for a semiconductor device, which is applicable for forming shallow junction source/drain regions. Because the conductivity of the source/drain region is increased, the source/drain region can adopt shallow junctions to prevent short channel effect and junction leakage.

As embodied and broadly described herein, the invention provides a method for forming a semiconductor device structure, which includes forming a silicon germanium (SiGe) layer on a substrate and a strained silicon layer on the SiGe layer. A gate oxide layer is further formed on the strained silicon layer and a gate structure is formed on the gate oxide layer. A doping step is then performed to form a lightly doped source/drain region in the strained silicon layer at both sides of the gate structure. Subsequent to forming a spacer on a sidewall of the gate structure, the gate structure and the strained silicon layer are heavily doped with n-type dopants to form an n-type gate structure and a heavily doped drain region in the strained silicon layer. Alternatively, the heavily doped drain region is formed in the strained silicon layer and the SiGe layer at both sides of the gate structure. A cap layer is further formed over the substrate. Subsequent to a cap annealing process, the cap layer is removed.

By growing a silicon layer on a SiGe layer, the channel at the strained silicon layer is under biaxial tensile strain. Further with the cap-annealing process, a compressive stress is generated on the n-type gate structure, which in turns introduces tensile strain to the strained silicon layer. The tensile strain of the strained silicon layer enhances the horizontal mobility of electrons in the channel. As a result, the operating speed of a device can also be increased.

For the manufacturing method of a semiconductor device of the present invention, because the source/drain region is located either in the strained silicon layer or in both the strained silicon layer and the SiGe layer with higher conductivity, the resistance of the source/drain region is effectively reduced.

Further, since the resistance of the source/drain region is effectively reduced, the source/drain region can be formed as shallow junctions, thus avoiding short channel effect and junction leakage.

For the semiconductor device of the present invention and the manufacturing method thereof, both the performance and the reliability of the device are improved.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

FIGS. 2A–2G are schematic, cross-sectional diagrams to illustrate the process flow for the manufacturing of a semiconductor device according to one aspect of this invention.

Figure 1:
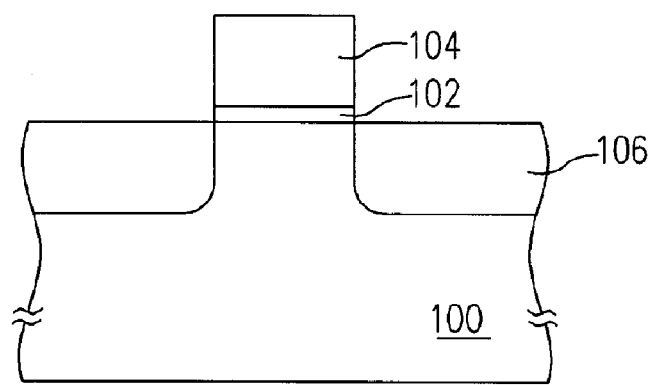
FIG. 1 is a cross-sectional view of a prior-art semiconductor device structure.
Figure 2A:
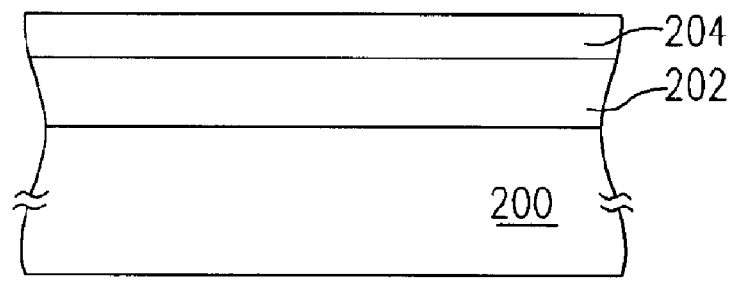
FIGS. 2A–2G are schematic, cross-sectional diagrams to illustrate the process flow for the manufacturing of a semiconductor device according to one aspect of this invention.

Referring to FIG. 2A, a substrate 200 is provided and a silicon germanium ($Si_{1-x}Ge_x$; SiGe) layer 202 is formed on the surface of the substrate 200. A strained silicon layer 204 is formed on the SiGe layer 202. The strained silicon layer 204 has a thickness of, for example, about 200 to 1000 angstroms. For example, the SiGe layer 202 and the strained silicon layer 204 are formed by ultra high vacuum chemical vapor deposition (UHV-CVD) on the substrate. The SiGe layer 202 is epitaxially grown on the substrate and the strained silicon layer 204 is epitaxially grown on the SiGe layer 202. For the UHV-CVD process, a reaction gas including $Si_2H_6/GeH_4$ is used, with a base pressure of about $2 \times 10^{-10}$ Torr, a deposition pressure of less than 1 mTorr and a rising temperature gradient of 150° C./minute, for example.

Due to the lattice mismatch with the SiGe layer 202, the strained silicon layer 204 is under biaxial tensile strain. The band structure is modified and the carrier transport is enhanced. The tensile strain of the strained silicon layer 204 on the relaxed SiGe layer 202 also improves the so-called surface roughness scattering.

Figure 2B:
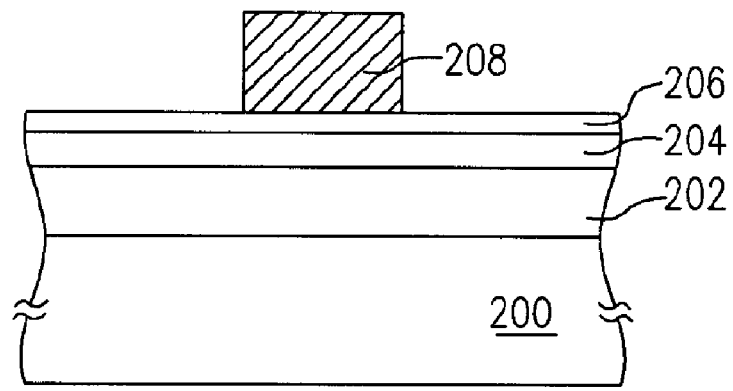

Referring to FIG. 2B, a gate oxide layer 206 is formed on the strained silicon layer 204. The gate oxide layer 206 is formed by thermal oxidation with a thickness of about 20–35 angstroms, for example.

It is noted that the underlying strained silicon layer 204 will be consumed and become thinner during the formation process of the gate oxide layer 206. The gate oxide layer 206 formed on the strained silicon layer 204 has a uniform thickness and the interface between the gate oxide layer 206 and the strained silicon layer 204 is smooth.

Afterwards, a gate structure 208 is formed on the gate oxide layer 206. The material for forming the gate structure 208 is, for example, polysilicon or silicon germanium. The process to form the gate structure 208 includes depositing a polysilicon layer or a silicon germanium layer (not shown) on the gate oxide layer 206 and patterning the polysilicon layer or the silicon germanium layer to form the gate structure 208, for example.

Figure 2C:
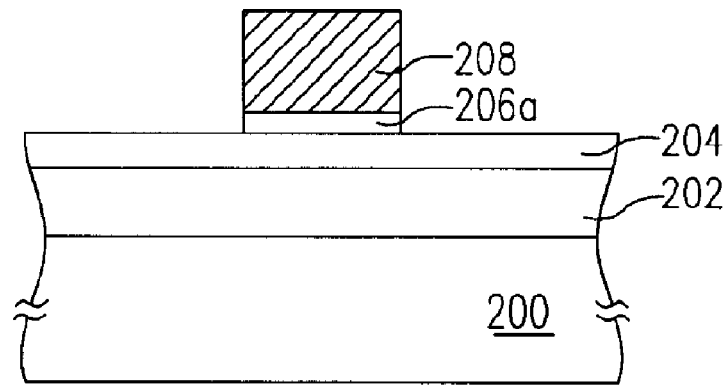

Referring to FIG. 2C, after forming the gate structure 208, the gate oxide layer 206 that is not covered by the gate structure 208 is removed, thus forming a gate oxide layer 206a remained underneath the gate structure 208.

Figure 2D:
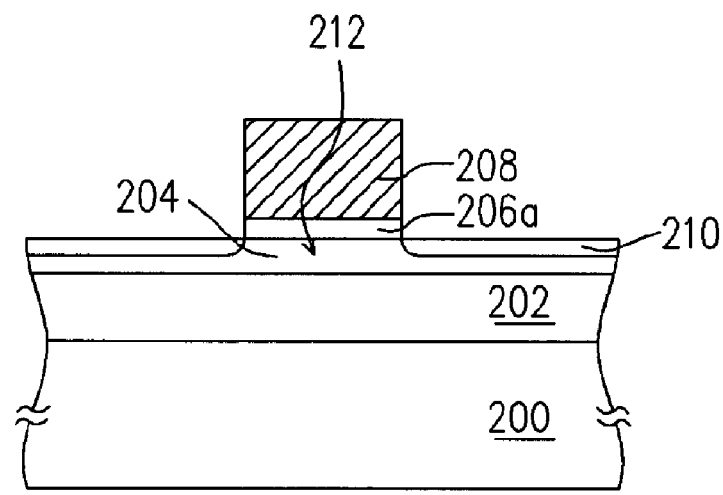
Figure 3A:
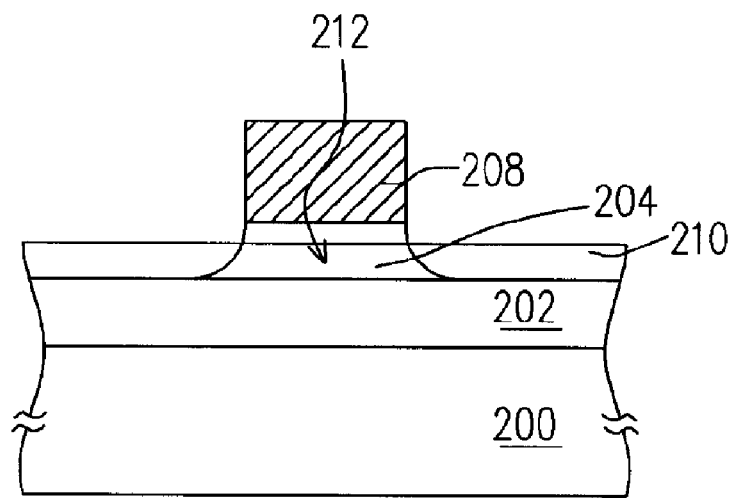
FIG. 3A is cross-sectional view of a semiconductor device of the present invention with a lightly doped region formed occupying the entire thickness of the strained silicon.

Referring to FIG. 2D, a lightly doped drain (LDD) region 210 is formed in the strained silicon layer 204 at both sides of the gate structure 208. For example, once the gate structure 208 is established, the gate structure 208 serves to mask an lightly doped drain (LDD) implant into a certain thickness of the strained silicon layer 204 at both sides of the gate structure 208 to form the LDD region 210. Alternatively, the lightly doped region 210 is formed occupying the entire thickness of the strained silicon layer 204 at both sides of the gate structure 208 as shown in FIG. 3A. The LDD implant comprises, for example, n-type species, such as, arsenic ions, for forming an NMOS transistor. Further, the dosage and the implant energy are chosen such that the LDD region 210 is shallower than and of lighter concentration than the subsequent source/drain region.

Since the LDD region 210 is configured in the strained silicon layer 204 at both sides of the gate structure 208, a channel region 212 is defined in the strained silicon layer 204 between the LDD region 210.

Figure 2E:
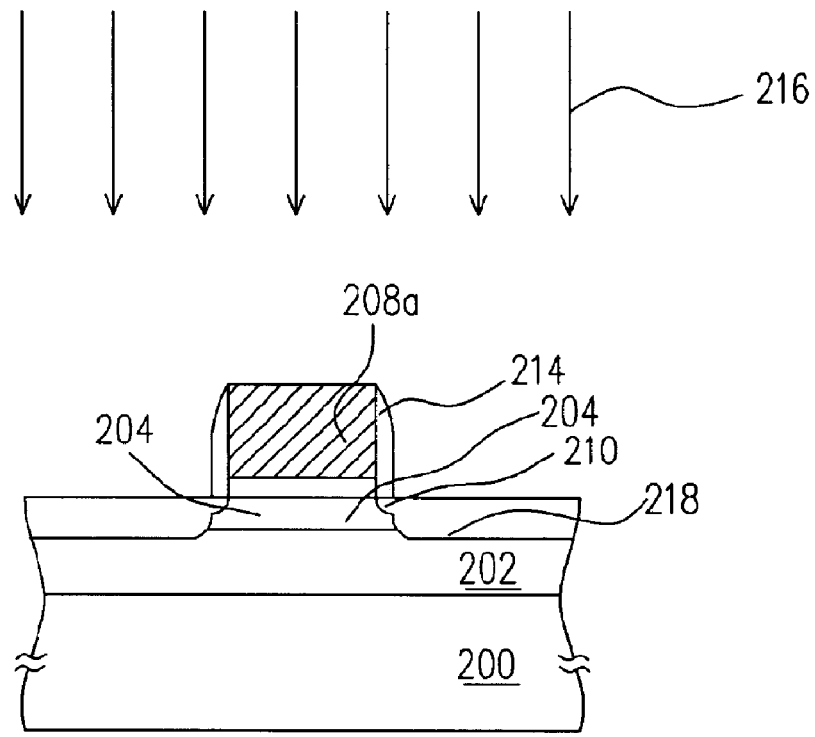

Continuing to FIG. 2E, a conformal spacer material (not shown) is deposited entirely over the semiconductor topography. The spacer material is, for example, a silicon nitride material or a silicon oxide material, and is preferably chemical vapor deposited (CVD) using the well known techniques. After the spacer material is deposited, a portion of the spacer material is removed to leave only the spacer material on the sidewall of the gate structure 208 as the spacer 214. The method to remove the portion of the spacer material includes anisotropic etching, such as, reactive ion etching.

Figure 3B:
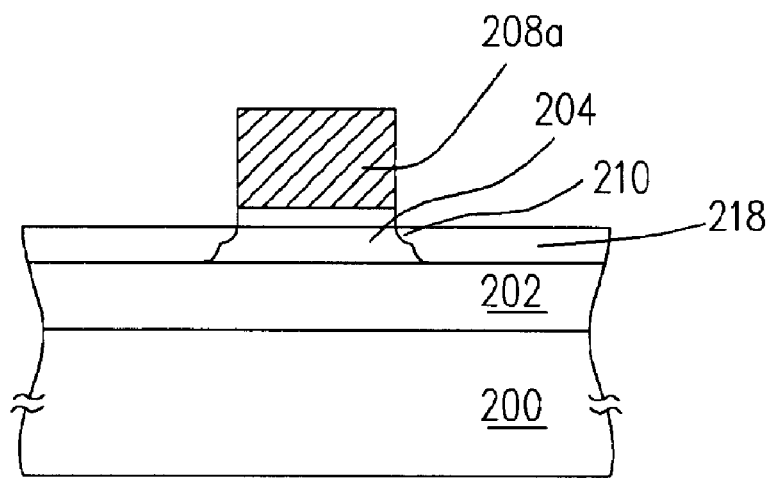
FIG. 3B and FIG. 3C are cross-sectional views of a semiconductor device structure of the present invention present invention with the heavily doped drain region formed in the strained layer and in the silicon germanium layer, respectively.
Figure 3C:
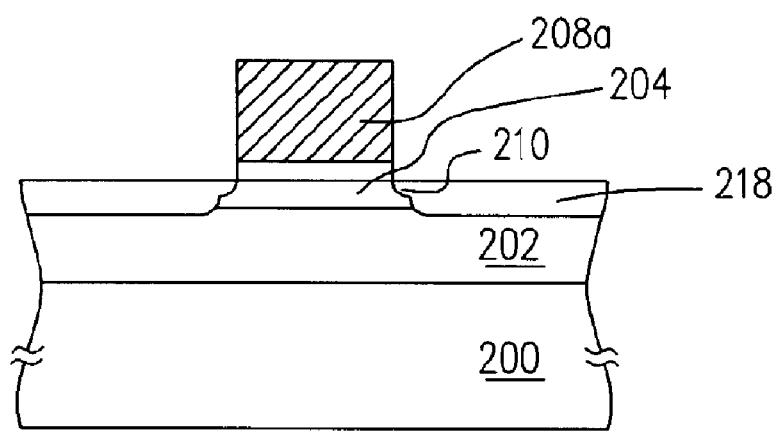

Still referring to FIG. 2E, an ion implantation process 216 is performed to implant dopants into the gate structure 208 and the strained silicon layer 204. The spacer 214 extends from the gate structure 208 a lateral distance sufficient to mask the implants to form the heavily doped source/drain regions 218 in the strained silicon layer 204 and the silicon germanium layer 202 beside both sides of the gate structure 208. Alternatively, the heavily doped source/drain regions 218 are formed only in strained silicon layer 204 as shown in FIG. 3B or only in the SiGe layer 202 as shown in FIG. 3C. The ion implantation process 216 is, for example, a high concentration n-type implants, such as, an implant of arsenic ions with a dosage of about $3E15/cm^2$ to $5E15/cm^2$ and an implant energy of about 60 KeV. Since n-type dopants, such as, arsenic ions, are implanted, after the ion implantation process 216, the gate structure 208 is transformed into an n-type gate structure 208a.

Figure 2F:
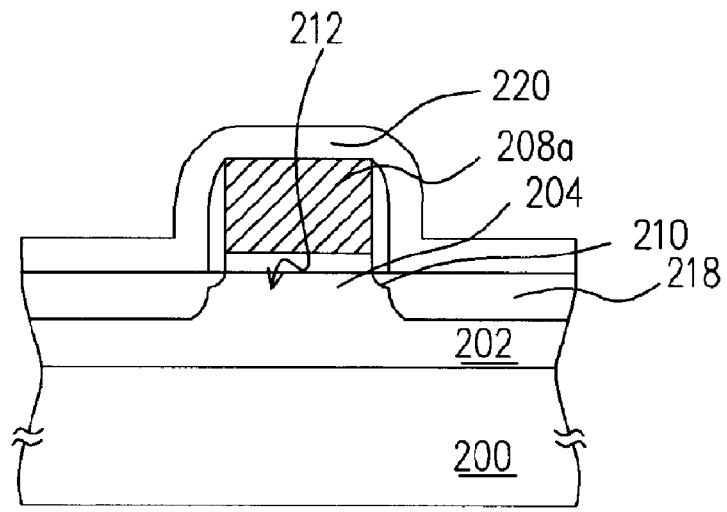

Continuing to FIG. 2F, a cap layer 220 is deposited entirely over the semiconductor topography, covering the gate structure 208a, the spacer 214 and the surface of the source/drain regions 218. The cap layer 220 is, for example, a silicon oxide layer formed to a thickness of about 300 angstroms to about 700 angstroms. The cap layer 220 is formed by, for example, a chemical vapor deposition technique at a temperature of about 400 degrees Celsius to about 500 degrees Celsius. After the cap layer 230 is deposited, a rapid thermal annealing (RTA) process is then conducted. The RTA process is conducted, for example, at a temperature about 1000 degrees Celsius for a duration of about 10 to 20 seconds. Due to the cap-annealing process, a compressive stress is generated on the n-type gate structure 208a. Consequently, the biaxial tensile strain in the strained silicon layer 204 underneath the gate structure 208a is enhanced.

Figure 2G:
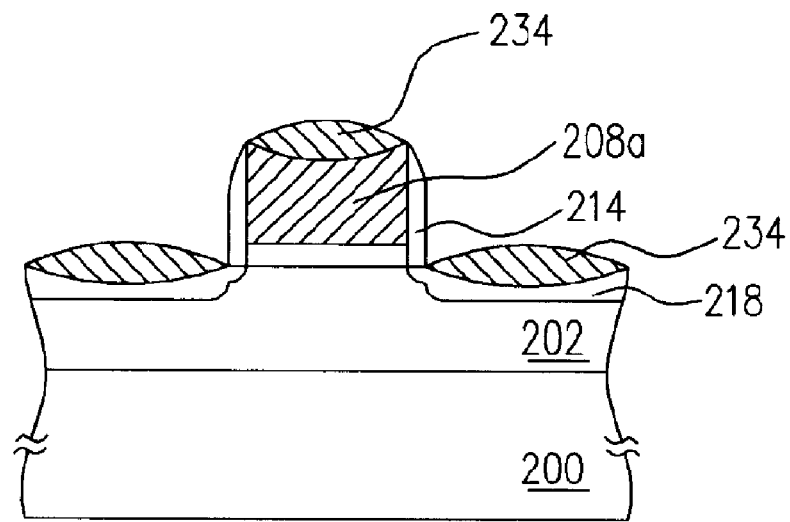

Referring to FIG. 2G, the cap layer 220 is subsequently removed. Thereafter, a metal layer (not shown) is formed over the semiconductor topography, covering the gate structure 208a, the spacer 214 and the surface of the heavily doped source/drain regions 218. The metal layer, which includes W, Ti, Ni, Mn, Co, Pt or Pd is formed by, for example, sputtering. After executing an annealing process, for example, at a temperature of about 400 to 800 degrees Celsius for about 20 to 60 seconds, the excess unreacted metal layer is selectively removed, for example, by wet etching. A silicide film 234 is formed atop the gate structure 208a and the heavily doped source/drain regions 218 to lower the sheet resistance at the source/drain area and the gate electrode. In the case a nickel silicide is formed, the consumption of silicon in the gate structure 208a and the strained silicon layer 204 can also be reduced. In the case the gate structure 208 is formed with a silicon germanium layer, the gate resistance can be further reduced. Similarly, when the heavily doped source/drain region is configured in the strained silicon layer 204 and the silicon germanium layer 202, a very low sheet resistance silicide, constructed with silicon germanium, can also be formed in the source/drain area.

Due to lattice mismatch with the SiGe layer 202, the strained silicon layer 204 is under biaxial tensile strain when it is being epitaxially grown on a SiGe layer. During the cap annealing process, a compressive stress is generated on the n-type gate structure 208bs due to the expansion of the arsenic ions implanted in the gate structure 208. A tensile strain is thereby further introduced to the strained-channel 212. The induced tensile strain modifies the band structure and enhances the carrier transport. Thus, if a field effect transistor is formed by using the strained silicon layer 204 as the channel, the horizontal mobility of electrons increases in the channel, and the operating speed of the transistor also increases. A higher amount of strain can be induced from generating tensile stress in the n-type gate.

The tensile strain of the strained silicon layer 204 on the relaxed SiGe layer 202 improves the so-called surface roughness scattering and the phonon scattering. Due to the improved surface roughness scattering-limited mobility and the phonon scattering-limited mobility of strained silicon, the electron mobility increases. Further, the current drive characteristics of a strained silicon device also exhibit improvement.

In accordance to the present invention, the source/drain region is formed in the strained silicon layer, the channel region is thus also located in the strained silicon layer. Because the conductivity of the SiGe layer is higher and the electron mobility in the strained silicon layer is faster compared with the conventional silicon substrate, resistance of the source/drain region can be efficiently reduced. Therefore, the source/drain region of the present invention can adopt shallow junctions, thus avoiding short channel effect and junction leakage. As a result, not only the device performance but also reliability of the device can be improved. Accordingly, the strained Si MOSFET of the present invention is promising in high performance deep sub-100 nm (sub-0.1 micron) CMOS technology.

In conclusion, in accordance to the manufacturing method of a semiconductor device of the present invention, a compressive stress is generated on the N-type gate. A tensile strain is also further being introduced to the channel disposed in the strained silicon layer underneath the N-type gate. The horizontal mobility of electrons thus increases in the channel.

Further, the source/drain region is located either in the strained silicon layer or in both the strained silicon layer and the SiGe layer with higher conductivity, the resistance of the source/drain region is effectively reduced.

Since the resistance of the source/drain region is effectively reduced, the source/drain region can be formed as shallow junctions, thus avoiding short channel effect and junction leakage.

For the manufacture method of a semiconductor device of the present invention, both the performance and the reliability of the device are improved.

Although in the above, the present invention has been described with respect to a NMOS device, the present invention is also applicable to devices, such as, high/low voltage transistors in the peripheral device region or other types of transistors.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a semiconductor device structure, the method comprising:

forming a silicon germanium (SiGe) layer on a substrate;

forming a silicon layer on the SiGe layer;

forming a gate oxide layer on the silicon layer;

forming a gate structure on the gate oxide layer;

forming a lightly doped drain region in the silicon layer;

forming a spacer on a sidewall of the gate structure;

performing a doping process on the silicon layer to form a heavily doped drain region beside the lightly doped drain region, and on the gate structure, wherein a dosage of the doping process is about 3E15 to about 5E15 ions/cm$^2$;

forming a cap layer over the substrate;

performing an annealing process; and removing the cap layer.

2. The method of claim 1, wherein the doping process is conducted using n-type dopants.

3. The method of claim 1, wherein the doping process is conducted using arsenic ions.

4. The method of claim 1, wherein the doping process is conducted with an implant energy of about 60 KeV.

5. The method of claim 1, wherein the cap layer is about 300 angstroms to about 700 angstroms thick.

6. The method of claim 1, wherein the cap layer comprises a silicon oxide layer.

7. The method of claim 1, wherein the annealing process is conducted at about 1000 degrees Celsius for about 10 to 20 seconds.

8. The method of claim 1 further comprises forming a silicide layer atop the gate structure and the heavily doped drain region.

9. The method of claim 8, wherein the silicide layer is selected from the group consisting of tungsten silicide, titanium silicide, nickel silicide, magnesium silicide, platinum silicide and palladium silicide.

10. The method of claim 1, wherein the heavily doped drain region is formed in the silicon layer.

11. The method of claim 1, wherein the heavily doped drain region is formed in the silicon layer and the silicon germanium layer.

12. The method of claim 1, wherein the heavily doped drain region is formed in the silicon germanium layer.

13. The method of claim 1, wherein the gate structure is formed with polysilicon or silicon germanium.

14. The method of claim 1, wherein the silicon layer is strained.

15. A fabrication method for a semiconductor structure, the method comprising:

providing a silicon substrate;

forming a gate electrode over the silicon substrate;

introducing n-type dopants to the silicon substrate to form source/drain regions in the substrate beside the gate electrode and to the gate electrode, wherein a dosage of the n-type dopants is about 3E15 ions/cm² to about 5E15 ions/cm²;

forming a cap layer over the doped polysilicon gate;

performing an annealing process; and removing the cap layer.

16. The method of claim 15, wherein the n-type dopants include arsenic ions.

17. The method of claim 15, wherein the annealing process comprises a rapid thermal annealing process conducted at about 1000 degrees Celsius for about 10 to 20 seconds.

18. The method of claim 15, wherein the cap layer is about 300 to about 700 angstroms thick.

19. The method of claim 15, wherein the cap layer comprises a silicon oxide layer deposited at about 400 degrees to 500 degrees Celsius.

20. The method of claim 15, wherein the gate electrode is formed with polysilicon or silicon germanium.

21. A fabrication method for a semiconductor device, the method comprising:

forming a silicon germanium (SiGe) layer on a substrate;

forming a silicon layer on the SiGe layer;

forming a gate oxide layer on the silicon layer;

forming a gate structure on the gate oxide layer;

implanting arsenic ions to the strained silicon layer to form a lightly doped drain region;

forming a spacer on a sidewall of the gate;

implanting arsenic ions to the strained silicon layer and a top surface of the silicon germanium layer to form a heavily doped drain region beside the lightly doped drain region and to the gate structure;

forming a cap layer over the substrate;

performing a rapid thermal annealing process;

removing the cap layer;

forming a nickel silicide layer atop the gate structure and the heavily doped drain region.

22. The method of claim 21, wherein the gate structure is formed with polysilicon or silicon germanium.

23. The method of claim 21, wherein a dosage used implanting the arsenic ions to the strained silicon layer and a top surface of the silicon germanium layer, and to the gate structure is about 3E15 to about 5E15 ions/cm².

* * * * *